US010662529B2

(12) United States Patent
Raj et al.

(10) Patent No.: US 10,662,529 B2
(45) Date of Patent: May 26, 2020

(54) COOLED GAS FEED BLOCK WITH BAFFLE AND NOZZLE FOR HDP-CVD

(71) Applicant: Applied Materials, Inc., Santa Clara, CA (US)

(72) Inventors: Govinda Raj, Bangalore (IN); Hanish Kumar, Bangalore (IN); Lin Zhang, San Jose, CA (US); Stanley Wu, San Ramon, CA (US)

(73) Assignee: Applied Materials, Inc., Santa Clara, CA (US)

(*) Notice: Subject to any disclaimer, the term of this patent is extended or adjusted under 35 U.S.C. 154(b) by 736 days.

(21) Appl. No.: 15/141,443

(22) Filed: Apr. 28, 2016

(65) Prior Publication Data

US 2017/0191161 A1    Jul. 6, 2017

Related U.S. Application Data

(60) Provisional application No. 62/275,217, filed on Jan. 5, 2016.

(51) Int. Cl.
  *C23C 16/455*    (2006.01)
  *C23C 16/44*     (2006.01)
  (Continued)

(52) U.S. Cl.
  CPC .... *C23C 16/45572* (2013.01); *C23C 16/4401* (2013.01); *C23C 16/4404* (2013.01);
  (Continued)

(58) Field of Classification Search
  CPC .............. C23C 16/45572; H01J 7/26; H01J 2235/1266
  (Continued)

(56) References Cited

U.S. PATENT DOCUMENTS 3,027,446 A * 3/1962 Browning .............. B23K 10/00
                                            219/75
3,393,142 A * 7/1968 Moseson ............... C23C 14/355
                                            204/192.12
(Continued)

FOREIGN PATENT DOCUMENTS

CN       1796286 A       7/2006
CN     102953049 A       3/2013
CN     103764869 A       4/2014

OTHER PUBLICATIONS

Office Action from CN Patent Application No. 201611178021.8 dated Sep. 25, 2019.

*Primary Examiner* — Marc E Norman
*Assistant Examiner* — Schyler S Sanks
(74) *Attorney, Agent, or Firm* — Patterson + Sheridan, LLP

(57) ABSTRACT

Techniques are disclosed for methods and apparatuses for reducing particle contamination formation in a high temperature processing chamber with a cooled gas feed block. The cooled gas feed has a body. The body has a main center portion having a top surface and a bottom surface. The body also has a flange extending outward from the bottom surface of the main center portion. A gas channel is disposed through the body. The gas channel has an inlet formed in the top surface of the main center portion and an outlet formed in the bottom surface of the main center portion. The body also has a center coolant channel. The center coolant channel has a first portion having an inlet formed in the top surface of the main center portion, and a second portion coupled to the first portion, the second portion having an outlet formed a sidewall of the flange.

20 Claims, 7 Drawing Sheets

(51) Int. Cl.
*H01J 37/32* (2006.01)
*C23C 16/507* (2006.01)

(52) U.S. Cl.
CPC .... *C23C 16/4405* (2013.01); *C23C 16/45563* (2013.01); *C23C 16/45591* (2013.01); *C23C 16/507* (2013.01); *H01J 37/321* (2013.01); *H01J 37/3244* (2013.01); *H01J 37/32449* (2013.01); *H01J 37/32522* (2013.01); *H01J 37/32853* (2013.01); *H01J 37/32467* (2013.01); *H01J 2237/327* (2013.01); *H01J 2237/335* (2013.01); *H01J 2237/3321* (2013.01); *H01J 2237/3322* (2013.01)

(58) Field of Classification Search
USPC .......................................... 62/259.1; 165/70
See application file for complete search history.

(56) References Cited

U.S. PATENT DOCUMENTS

| | | | | |
|---|---|---|---|---|
| 3,565,039 A * | 2/1971 | Remer | ..................... | D06B 1/14 118/325 |
| 4,644,906 A * | 2/1987 | Garabedian | ............ | F22B 1/066 122/32 |
| 4,737,337 A * | 4/1988 | Garabedian | ............ | F22B 1/066 165/70 |
| 5,103,742 A * | 4/1992 | Valentino | ............... | B01D 53/74 110/185 |
| 5,656,138 A * | 8/1997 | Scobey | ............... | C23C 14/0047 204/192.12 |
| 5,870,271 A * | 2/1999 | Herchen | ............. | H01L 21/6838 361/234 |
| 5,994,662 A * | 11/1999 | Murugesh | ........... | H01J 37/3244 156/345.33 |
| 6,015,465 A * | 1/2000 | Kholodenko | ......... | H01J 37/321 118/712 |
| 6,063,199 A * | 5/2000 | Sajoto | ................ | C23C 16/4401 118/715 |
| 6,077,357 A * | 6/2000 | Rossman | ........... | C23C 16/4585 118/723 R |
| 6,083,344 A * | 7/2000 | Hanawa | ........... | H01J 37/32174 156/345.28 |
| 6,189,483 B1 * | 2/2001 | Ishikawa | ............. | C23C 16/4405 118/723 E |
| 6,189,484 B1 * | 2/2001 | Yin | ........................ | H01J 37/321 |
| 6,258,170 B1 * | 7/2001 | Somekh | .............. | C23C 16/4401 118/715 |
| 6,306,455 B1 * | 10/2001 | Takamori | .......... | H01L 21/67248 118/52 |
| 6,379,466 B1 * | 4/2002 | Sahin | .................... | C23C 16/455 118/715 |
| 6,385,977 B1 * | 5/2002 | Johnson | ........... | H01J 37/32082 62/64 |
| 6,403,491 B1 * | 6/2002 | Liu | ................... | H01J 37/32522 257/E21.252 |
| 6,972,115 B1 * | 12/2005 | Ballard | .................. | B01J 19/088 422/186.04 |
| 7,138,016 B2 * | 11/2006 | Reardon | .......... | H01L 21/67075 118/313 |
| 2002/0073922 A1 * | 6/2002 | Frankel | ................. | C23C 16/401 118/715 |
| 2002/0185229 A1 * | 12/2002 | Brcka | ................... | H01J 37/321 156/345.48 |
| 2003/0045098 A1 * | 3/2003 | Verhaverbeke | ... | H01L 21/67069 438/689 |
| 2003/0054099 A1 * | 3/2003 | Jurgensen | ........... | C23C 14/0015 427/248.1 |
| 2004/0025791 A1 * | 2/2004 | Chen | ..................... | H01J 37/321 118/728 |
| 2004/0050685 A1 * | 3/2004 | Yara | .................... | C23C 16/4409 204/164 |
| 2006/0251917 A1 * | 11/2006 | Chiang | ................ | C23C 14/046 428/674 |
| 2007/0032047 A1 * | 2/2007 | Hasebe | ................ | C23C 16/345 438/478 |
| 2007/0034153 A1 * | 2/2007 | Lu | ........................ | H01J 37/321 |
| 2008/0271471 A1 * | 11/2008 | Nozawa | ............ | C23C 16/4411 62/179 |
| 2009/0095220 A1 * | 4/2009 | Meinhold | ......... | C23C 16/45565 118/712 |
| 2014/0262034 A1 * | 9/2014 | Ishibashi | ........... | C23C 16/45563 156/345.29 |
| 2014/0290578 A1 * | 10/2014 | Wamura | ............. | C23C 16/4401 118/725 |
| 2015/0013938 A1 * | 1/2015 | Yoshimura | ........ | H01J 37/32522 165/67 |
| 2015/0047565 A1 * | 2/2015 | Komori | .................... | F28B 9/08 118/724 |
| 2015/0232983 A1 * | 8/2015 | West | .................... | C23C 14/541 427/248.1 |

\* cited by examiner

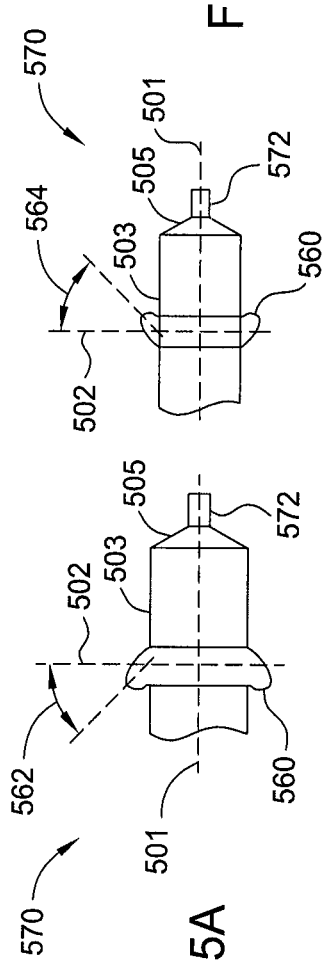
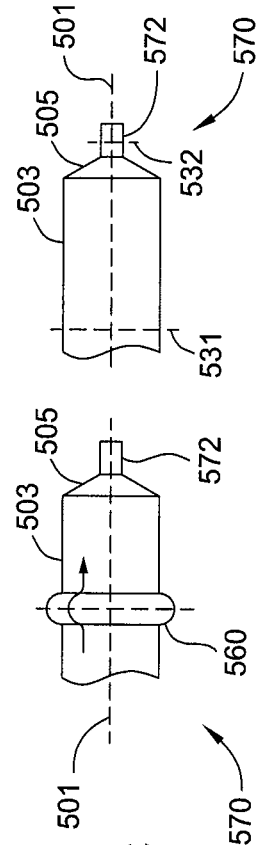
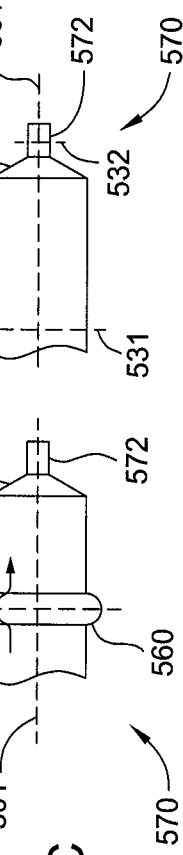
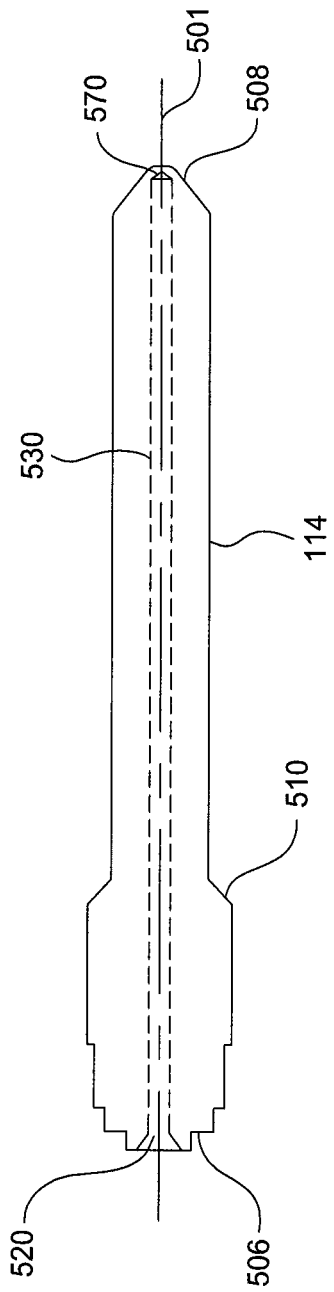
FIG. 5A
FIG. 5B
FIG. 5C
FIG. 5D
FIG. 5

COOLED GAS FEED BLOCK WITH BAFFLE AND NOZZLE FOR HDP-CVD

CROSS-REFERENCE TO RELATED APPLICATIONS

This application claims benefit of U.S. Provisional Application Ser. No. 62/275,217, filed Jan. 5, 2015, of which is incorporated by reference in its entirety.

BACKGROUND

Field

Embodiments described herein generally relate to semiconductor manufacturing and more particularly to protecting processing equipment from corrosion and contamination.

Description of the Related Art

During the manufacture of semiconductor devices, a substrate may undergo many operations in a variety of processing chambers for the purpose of forming material layers and features suitable for an end use. For example, the substrate may undergo several depositions, annealing, and etching operations, among other operations. The processing chambers are formed from a variety of components formed from aluminum containing compounds, steel containing compounds, nickel containing compounds, among other compounds. These compounds may additionally contain chromium, titanium and molybdenum among other materials.

Device miniaturization has made small dimensions for device patterns formed in a film layer of the substrate more critical. Achieving the critical dimensions in the substrate begins with a good quality film layer having good adhesion to the underlying film layers in the substrate. The processing equipment minimizes contamination in the chamber environment from affecting or forming on the substrates to achieve good quality films.

Complete disassociation of the process gases when forming plasma enhances the quality of films deposited on the substrate. Using high temperatures provides more complete disassociation of the process gases and also provides strong adhesion of the high quality film on the substrate. However, during continuous operation of the processing chamber, the corrosive agents in the chamber attack the chamber components and generate residual particles which increase the concentration of contamination in the interior volume of the processes chamber. Over time, the concentration of the residual particles in the interior volume of the processing chamber trend upward. The residual particles in the deposition environment eventually find its way into the films deposited on the substrate and undesirably contribute to process contamination and process skew. To prevent process contamination and process skew, the processing chamber environment may require monitoring and periodic cleaning.

Therefore, there is a need for improved chamber components.

SUMMARY

Techniques are disclosed for methods and apparatuses for reducing particle contamination formation in a high temperature processing chamber with a cooled gas feed block. In one embodiment, the cooled gas feed has a body. The body has a main center portion having a top surface and a bottom surface. The body also has a flange extending outward from the bottom surface of the main center portion. A gas channel is disposed through the body. The gas channel has an inlet formed in the top surface of the main center portion and an outlet formed in the bottom surface of the main center portion. The body also has a center coolant channel. The center coolant channel has a first portion having an inlet formed in the top surface of the main center portion, and a second portion coupled to the first portion, the second portion having an outlet formed a sidewall of the flange.

In another embodiment, a processing chamber has a chamber body. A lid is disposed on the chamber body. At least one gas cooled feed block is coupled to an exterior of at least one of the chamber body and lid. The gas cooled feed block has a body. The body has a main center portion having a top surface and a bottom surface. The body also has a flange extending outward from the bottom surface of the main center portion. A gas channel is disposed through the body. The gas channel has an inlet formed in the top surface of the main center portion and an outlet formed in the bottom surface of the main center portion. The body also has a center coolant channel. The center coolant channel has a first portion having an inlet formed in the top surface of the main center portion, and a second portion coupled to the first portion, the second portion having an outlet formed a sidewall of the flange.

In yet another embodiment, a method is disclosed for providing gas into a processing chamber. The method begins by flowing a first coolant through a centerline of a cooled gas block. A process gas is then flowed through a cooled gas block offset from the centerline of the cooled gas block. Finally, a second coolant is flowed through a channel outward of the process gas flow.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 is a side schematic view of one of the gas nozzles shown in FIG. 1.

FIGS. 5A through 5D are side schematic views depicting internal profiles for a nozzle tip shown in FIG. 5.

Figure 1:
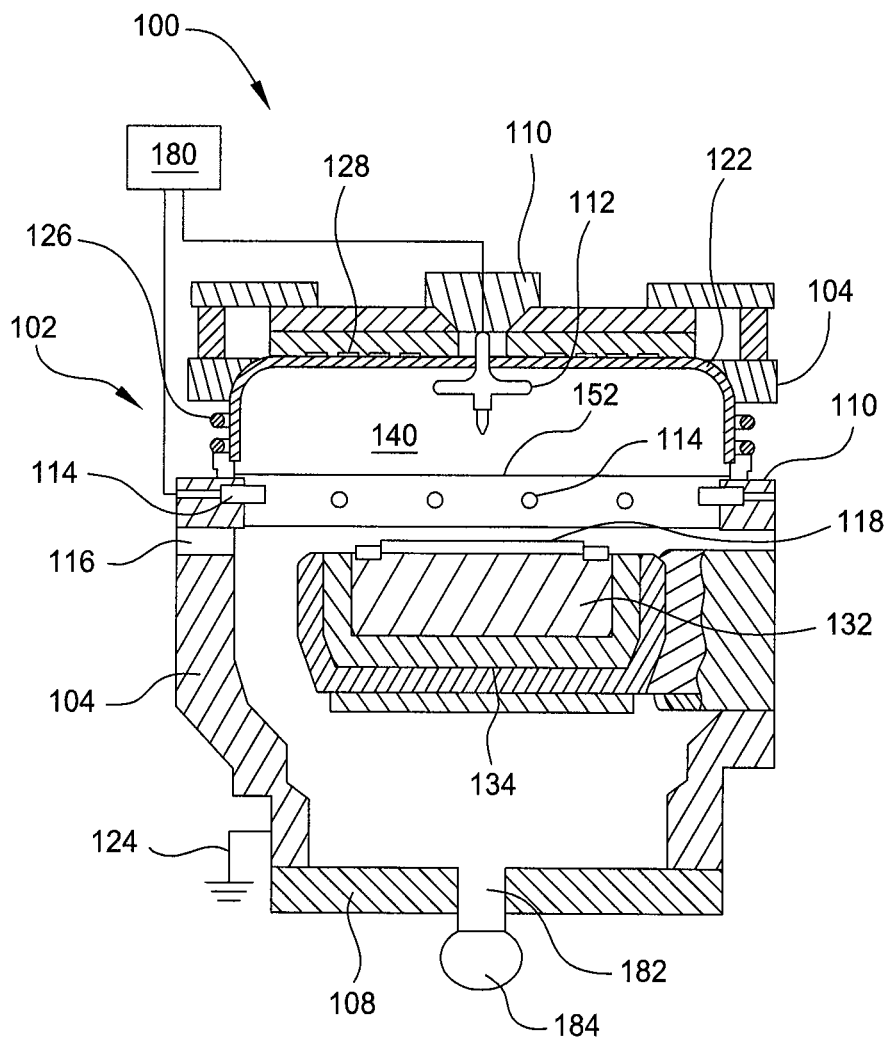
FIG. 1 is a front schematic view of an example processing chamber having cooled gas feed blocks attached to a gas baffle and one or more gas nozzles.

To facilitate understanding, identical reference numerals have been used, where possible, to designate identical elements that are common to the figures. It is contemplated that elements and features of one embodiment may be beneficially incorporated in other embodiments without further recitation. Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include cooled gas feed block with a baffle and nozzles. The cooled gas feed block, baffle and nozzles may be deployed in processing chambers using high temperatures, such as chemical vapor deposition (CVD), high density plasma chemical vapor deposition (HDP-CVD) chambers, low-pressure chemical vapor deposition (LP-CVD) chambers, or other processing chambers utilizing high temperatures and process gasses. The disclosed baffles and nozzles have lower thermal conductivity prevented the baffles and nozzles from heating up to very high temperature which may increase particle formation within the processing chamber during operation and cleaning. The material selection for the baffle and nozzle from and the disclosed cooled gas feed block having a cooling channel to maintain the assembly at low operating temperatures, helps reduce the particle formation in the processing chambers. In this manner, the life of the nozzles and baffles is extended along with the mean time between cleaning, i.e., downtime of the associated process equipment.

FIG. 1 is a front schematic view of a processing chamber 100 having a cooled gas feed block 110 attached to a baffle 112 and one or more nozzles 114. The processing chamber 100 may be a chemical vapor deposition (CVD) processing chamber, hot wire chemical vapor deposition (HWCVD) processing chamber, or other vacuum chamber for processing substrates at elevated temperatures. In one embodiment, the processing chamber 100 is a high density plasma chemical vapor deposition (HDP-CVD) chamber.

The processing chamber 100 includes a chamber body 102 having a top 106, chamber sidewalls 104 and a chamber bottom 108 which are coupled to a ground 124. The top 106, the chamber sidewalls 104 and the chamber bottom 108 define an interior processing volume 140. The chamber sidewalls 104 may include a substrate transfer port 116 to facilitate transferring a substrate 118 into and out of the processing chamber 100. The substrate transfer port 116 may be coupled to a transfer chamber and/or other chambers of a substrate processing system.

The dimensions of the chamber body 102 and related components of the processing chamber 100 are not limited and generally are proportionally larger than the size of the substrate 118 to be processed therein. Examples of substrate sizes include 200 mm diameter, 250 mm diameter, 300 mm diameter and 450 mm diameter, among others.

A pumping port 182 may be formed in the chamber bottom 182. A pumping device 184 is coupled to the pumping port 182 to evacuate and control the pressure within the interior processing volume 140 of the processing chamber 100. The pumping device 184 may include one or more of a throttle valve, a roughing pump, roots blower, turbo molecular pump or other similar devices that are adapted control the pressure in the interior processing volume 140.

A pedestal 134 for holding the substrate 118 may be disposed in the interior processing volume 140. The pedestal 134 may be supported by the chamber sidewall 104 or chamber bottom 108. The pedestal 134 may have cooling fluid channels and other conventional features not crucial to the present invention. The pedestal 134 may include a substrate support 132. The substrate support 132 may be a heater, electrostatic chuck (ESC) or other suitable device for supporting or chucking the substrate 118 to the pedestal 134 during processing. The substrate support 132 may be formed from a dielectric material, for example a ceramic material, such as aluminum nitride (AlN) among other suitable materials. The substrate support 132 may include a chucking electrode (not shown) connected to a chucking power source. The substrate support 132 may additionally, or alternately, include a heater electrode (not shown) connected to a heater power source. The substrate support 132 may use electro-static attraction to hold the substrate 118 to the substrate support 132 and apply heat to the substrate 118 during processing in the processing chamber 100.

A top coil 128 and/or side coils 126 may be disposed on the chamber body 102 of the processing chamber 100. The top coil 128 and side coils 126 may be connected to one or more RF power sources (not shown). The top coil 128 and side coils 126 induce an electromagnetic field in the processing volume for maintaining a plasma formed from process gasses.

A gas panel 180 supplies process and other gases through the nozzles 114 and/or baffle 112 into the interior processing volume 140 of the chamber body 102. The gas panel 180 may be configured to provide one or more process gas sources, inert gases, non-reactive gases, reactive gases, or cleaning gases if desired. Examples of process gases that may be provided by the gas panel 180 include, but are not limited to, a silicon (Si) containing gases, carbon precursors and nitrogen containing gases. In one embodiment, the gas panel provides a cleaning gas such as nitrogen trifluoride ($NF_3$).

The baffle 112 may be attached through one of the cooled gas feed block 110 to the gas panel 180. The baffle 112 may be disposed through the dome 122 of the processing chamber 100 and is spaced above the substrate support 132. One or more process gases provided from the gas panel 180 may supply reactive species through the baffle 112 into the interior processing volume 140. The baffle 112 may be exposed to and heated by the high temperature of the interior processing volume 140 and plasma formed therein. The temperature of the baffle 112 may be regulated by the cooled gas feed block 110. Additionally, the baffle 112 may be formed from a material having low thermal conductivity to help regulate the temperature of the baffle 112. For example, the baffle 112 may be formed from aluminum nitride (AlN), alumina ($Al_2O_3$), or other suitable material. Alternately, the baffle 112 may be replaced by one or more nozzles 114 disposed through the dome 122.

The nozzles 114 may be attached through respective cooled gas feed blocks 110 to the gas panel 180. The nozzles 114 may be disposed on a ring 152 about the interior processing volume 140 proximal the chamber sidewall 104. Alternately, the nozzles 114 may be disposed through and supported by the chamber sidewall 104. Additionally, as mentioned above, the nozzles 114 may be disposed through the dome 122. The nozzles 114 disposed through the chamber sidewall 104 may circumscribe the interior processing volume 140 to control the concentration of process gases flowing therefrom throughout the interior processing volume 140 of the processing chamber 100. In this manner, the concentration and distribution of ions generated from the process gases may be controlled over the surface of the substrate 118 undergoing processing in the processing chamber 100. For example, between about 4 and 24 or more nozzles 114, such as 18 nozzles 114, may be spaced in smaller groups, equally spaced, or in other suitable configurations about the interior processing volume 140. The nozzles 114 may be exposed to and heated by the high temperature of the interior processing volume 140 and plasma formed therein. The temperature of the nozzles 114 may be regulated by the cooled gas feed block 110. Additionally, the nozzles 114 may be formed from a material having low thermal conductivity to help regulate the temperature of the nozzle 114. For example, the nozzle 114 may be formed from aluminum nitride (AlN), alumina ($Al_2O_3$), or other suitable material.

The nozzles 114 and baffle 112 are exposed to high temperatures, such as a temperature exceeding 400° Celsius, in the interior processing volume 140 of the processing chamber 100 during processing of the substrate 118. A cleaning gas, such as of a fluorine, may be introduced to portions of the nozzles 114 and baffle 112 exposed to the interior processing volume 140 during cleaning operations. Buildup of sputtered material inside the processing chamber 100 which consist of AlF and $SiO_2$ at elevated temperatures, such as above 400° Celsius, may lead to aluminum fluoride ($AlF_3$) formation during cleaning cycles and also by pyrolysis of silane during deposition. The cooled gas feed block 110 helps to maintain the temperatures of the nozzles 114 and baffle 112 at a temperature below 400° Celsius for preventing the formation of $AlF_3$ particles, i.e., contamination.

A significant cause of particle formation in the processing chamber at temperatures above 400° Celsius is fluorine ions attacking the aluminum chamber components. For example, at temperatures exceeding 400° Celsius, chamber components formed from $Al_2O_3$ are attacked by the fluorine ions ($F^-$) produced from the $NF_3$ cleaning gas and generate byproducts of $AlF_3$ and $O_2$. The formation of the $AlF_3$ can be mitigated by reducing the temperature of the $Al_2O_3$ chamber components to below 400° Celsius. Additionally, the chamber components may be formed from materials other than $Al_2O_3$ to reduce the formation of $AlF_3$.

Figure 2:
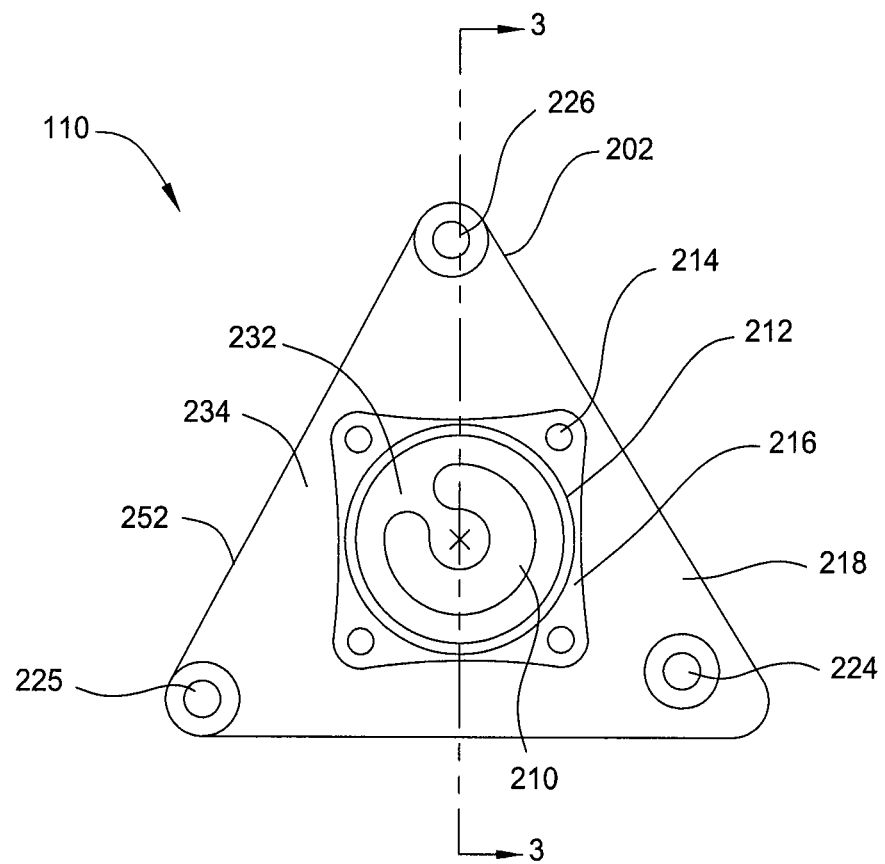
FIG. 2 is a bottom schematic view of one of the cooled gas feed blocks shown in FIG. 1.

FIG. 2 is a bottom schematic view of one of the cooled gas feed blocks 110 shown in FIG. 1. The cooled gas feed block 110 is configured to reduce the temperature of chamber components, such as the nozzles 114 and baffle 112, to less than about 400° Celsius to reduce the formation of $AlF_3$. The cooled gas feed block 110 has a body 202. The body 202 has a bottom surface 218. The body 202 may have a shape suitable for interfacing with the gas lines connected to the gas panel 180, the processing chamber 100 and either one of the nozzles 114 or baffle 112. For example, the bottom surface 218 of the body 202 may be substantially rectangular, triangular, circular, or any other suitable shape. The body 202 has a gas channel 210 disposed therethrough. Process and cleaning gases from the gas panel 180 moves through the gas channel 210 and the nozzle 114 into the processing chamber 100.

A plurality of mounting points 224, 225, 226 may be formed at an outer periphery 252 of the body 202. The mounting points 224, 225, 226 are shown to be on a flange 349 in FIG. 3. The mounting points 224, 225, 226 may be through holes, lugs, or other suitable features for attaching the cooled gas feed block 110 to the processing chamber 100.

A recessed surface 216 may be formed into the bottom surface 218. The recessed surface 216 may be milled, cast, printed or formed by other suitable manufacturing techniques. Optionally, a plurality of bushings 214 may be disposed in the recessed surface 216 portion of the body 202. The bushings 214 are configured to accept fasteners for attaching the cooled gas feed block 110 to components of the processing chamber 100 such as the nozzle 114 or baffle 112.

A gasket groove 212 may be formed in the recessed surface 216. The gasket groove 212 may be shaped in circular or other polygonal ring shape configured to accept a sealing member therein such as a gasket, O-ring, or other suitable seal for fluidly isolating an inner portion 232 of the body 202 from an outer portion 234. In one embodiment, the gasket groove 212 accepts an O-ring to fluidly seal the inner portion 232 and prevent gas flowing through the gas channel 210 from escaping out into the outer portion 234 of the cooled gas feed block 110. The nozzle 114 or baffle 112 may be attached to the bushings 214 in the body 202 and compress the gasket in the gasket groove 212 for forming the fluid tight seal.

Figure 3:
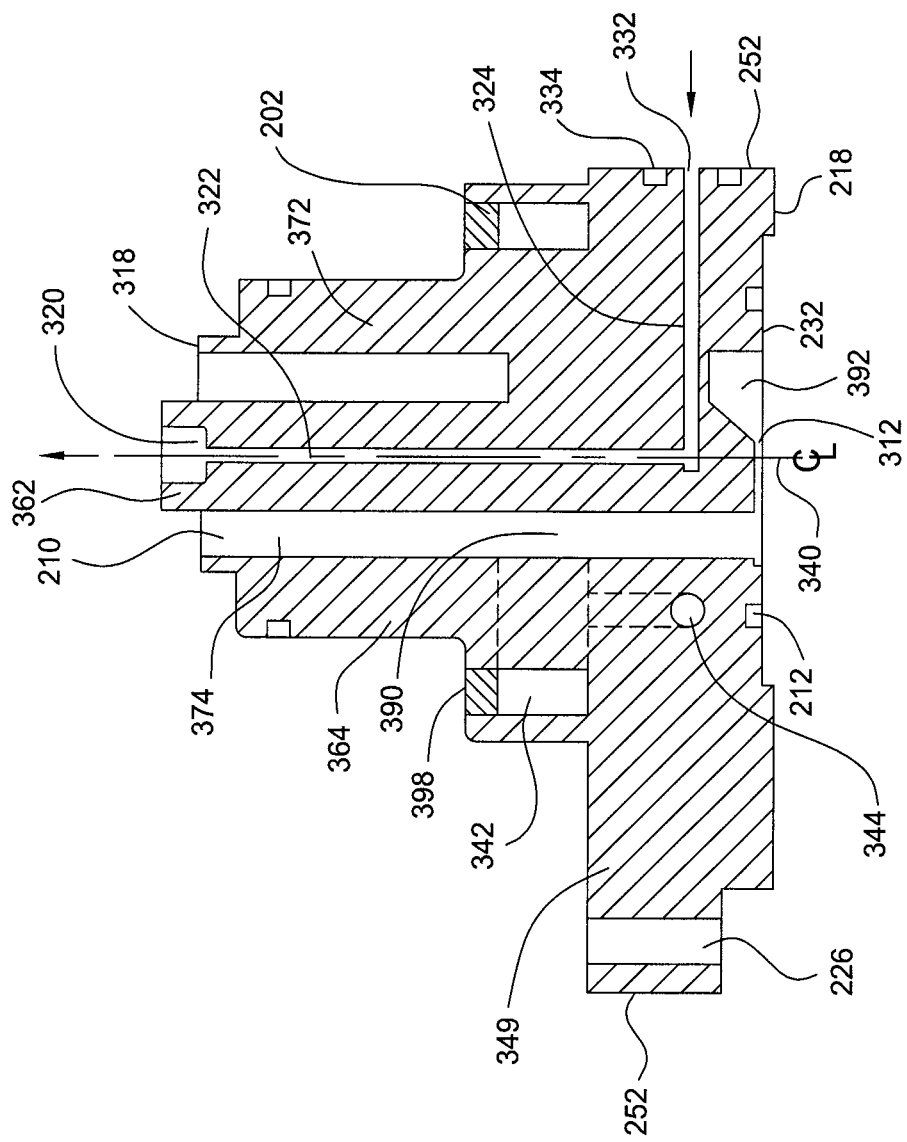
FIG. 3 is a cross sectional view of the cooled gas feed block of FIG. 2.

FIG. 3 is a cross sectional view of the cooled gas feed block 110 of FIG. 2 taken through the section line 3-3. FIG. 3 illustrates the gas and cooling channels in the cooled gas feed block 110. The body 202 of the cooled gas feed block 110 has a center portion 372. The flange 349 extends from the center portion 372 of the body 202. The body 202 has a top 318. The top 318 is fluidly attached to the gas panel 180. The gas channel 210 extends from the bottom surface 218 to the top 318 of the cooled gas feed block 110. The gas panel 180 may be attached to the top 318 of the cooled gas feed block 110 for supplying gas to the processing chamber 100 disposed at the bottom surface 218.

The gas channel 210 may have an arc shaped top manifold 394 at the top 318. The gas channel may have an arc shaped bottom manifold 392 at the bottom surface 218. In one embodiment, the arc shaped bottom manifold 392 may be closed along a centerline 340 of the center portion 372 of the body. In another embodiment, a recess 312 may be formed in the bottom surface 218 and the arc shaped bottom manifold 392 may be open along a centerline 340 of the center portion 372 of the body. A central conduit 390 may fluidly connect the top and bottom manifolds 394, 392.

One of more cooling channels are disposed through the body 202 of the cooled gas feed block 110 for maintaining a temperature of the cooled gas feed block 110. A center coolant channel 320 is disposed at least partially through a centerline 340 of the body 202. The center coolant channel 320 may have a second portion 322 substantially parallel to the gas channel 210. An inner wall 362 of the body 202 is disposed between the gas channel 210 and the center coolant channel 320. Cooling fluid flowing through the second portion 322 may flow in a direction opposite that of process gas flowing through the gas channel 210. The second portion 322 regulates the temperature of the gas flowing through the cooled gas feed block 110.

A side coolant port 332 may be disposed on the outer periphery 252 of the body 202. For example, the side coolant port 332 may be formed on the flange 349. A seal gland 334 may be disposed about the side coolant port 332 for fluidly connecting the side coolant port 332 with a coolant source. The side coolant port 332 is fluidly connected in the body 202 to a first portion 324 of the center coolant channel 320. The first portion 324 may be substantially parallel to the bottom surface 218 of the cooled gas feed block 110. Coolant flows into the side coolant port 332 and through the first portion 324 of the center coolant channel 320 for regulating the temperature of the body 202 of the cooled gas feed block 110 at the bottom surface 218 and thus the nozzle 114 or baffle 112 attached thereto.

The flow of the cooling fluid through the center coolant channel 320 may be from the first portion 324 to the second portion 322. The first portion 324 may connect to the second portion at an angle. The angle may be between about 80 degrees and about 100 degrees, such as about 90 degrees. Advantageously, the flow of the coolant regulates the higher temperature of the nozzle 114, chamber body 102, or baffle 112, prior to regulating the lower temperature of the process gases flowing through the gas channel 210. In this manner, more heat is removed from the nozzle 114 or baffle 112 by the cooled gas feed block 110.

A coolant channel 342 may be disposed through the body 202 of the cooled gas feed block 110. The coolant channel 342 may be formed in the center portion 372 of the body 202. For example, the coolant channel 342 may be formed through additive manufacture such as 3D printing, milling or other suitable method. In methods of formation in which the manufacturing process is subtracting material, such as milling, a plug 398 may seal the coolant channel 342 and prevent leakage of coolant therefrom. A second side coolant port 344 may be disposed on the outer periphery 252 of the body 202. For example, the second side coolant port 344 may be formed on the flange 349. The second side coolant port 344 is fluidly connected to the coolant channel 342. An outer wall 364 of the body 202 is disposed between the gas channel 210 and the coolant channel 342. Coolant may be flowed into the second side coolant port 344 and through the coolant channel 342 for regulating the temperature of the body 202 of the cooled gas feed block 110.

The inner wall 362 disposed adjacent the gas channel 210 conducts heat transfer between the process and cooling gases flowing through the gas channel 210 and the coolant flowing through the center coolant channel 320. The outer wall 364 disposed adjacent to the coolant channel 342 and the gas channel 210 may also conduct heat transfer between the process and cooling gases flowing through the gas channel 210 and the coolant flowing through the coolant channel 342. In this manner, a temperature for the process and cleaning gases may be maintained and the temperature of the process and cleaning gases substantially regulate the temperature of the nozzle 114 and/or baffle 112 attached to the cooled gas feed block 110.

The body 202 may be formed of a material promoting heat transfer. For example, the body 202 may be formed from aluminum having cooling channels, such as center coolant channel 320 and coolant channel 342, drawing heat away from the cooled gas feed block 110. The body 202 may be formed from a single mass of material to promote efficient heat transfer. Thus, the cooled gas feed block 110 may act as a heat sink for chamber components attached thereto such as the nozzle 114 and baffle 112. The body 202 can be manufactured in 2 pieces, by machining and welding or as a single piece by 3D printing.

Figure 4:
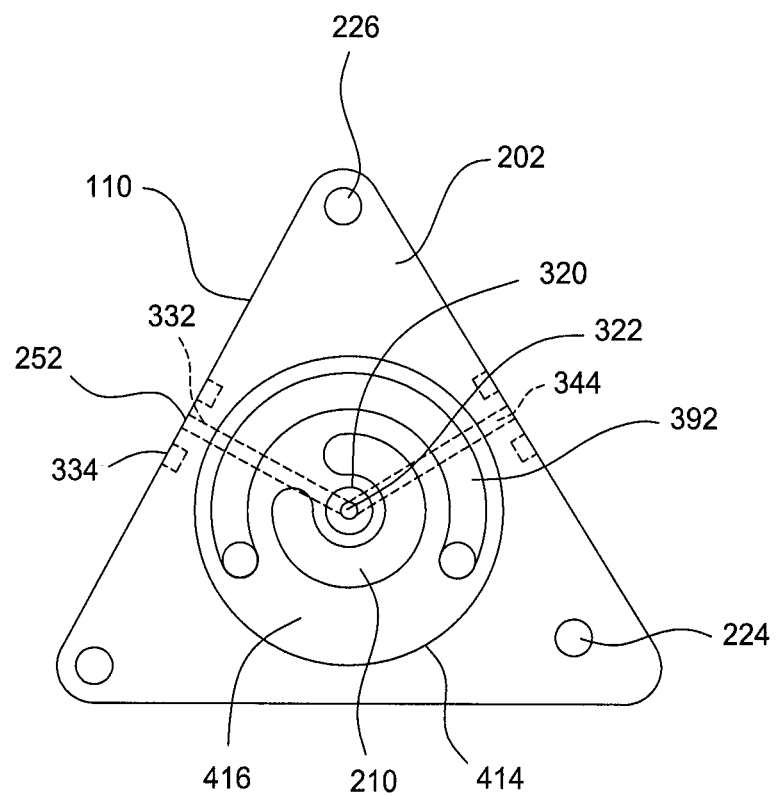
FIG. 4 is a top schematic view of the cooled gas feed block of FIG. 2.

FIG. 4 is a top schematic view of the cooled gas feed block 110 of FIG. 2. The top 318 may have a raised portion 414. The raised portion 414 may provide extra mass for the body 202 to help regulate the temperature of the cooled gas feed block 110 when cooling fluids are flowed therethrough. The raised portion 414 may have a top surface 416. In one embodiment, the coolant channel 342 is disposed into the top surface 416. The coolant channel 342 may be formed through additive manufacturing techniques or other suitable methods such as milling or casting. The cooling channels may seal against the chamber sidewall 104, dome 122 or other chamber component. Coolant flowing through the coolant channel 342 may be in contact with the nozzle 114 or baffle 112 and remove heat from said chamber components. Alternately, the coolant channel 342 may be disposed within the body 202 and below the top surface 416. Coolant flowing through the coolant channel 342 may remove heat from the body 202 of the cooled gas feed block 110. The nozzle 114 or baffle 112 may be cooled by the cooled gas feed block 110 by conduction.

The cooled gas feed block 110 may therefore maintain temperatures well below 400° degrees Celsius for attached chamber components and process gases. The cooled process gases may also provide cooling to the nozzle 114 or baffle 112 for maintaining the temperatures of the nozzle 114 or baffle 112 below about 400° degrees Celsius.

FIG. 5 is a side schematic view of one of the nozzles 114 shown in FIG. 1. The nozzle 114 has a body 510. The body 510 of the nozzle 114 may be formed from a ceramic material. For example, the body 510 may be formed from alumina, aluminum nitride, yttria, or other suitable material. In one embodiment, the body 510 of the nozzle 114 is formed from aluminum nitride. The nozzles 114 formed from alumina have a low thermal conductivity value of less than about 15 W/mK and run at higher temperatures then those formed from aluminum nitride. The nozzles 114 formed from aluminum nitride have a very high thermal conductivity of greater than about 120 W/MK and does not get heated up during the plasma operations in the processing chamber 100. Thus, forming the nozzles 114 from aluminum nitride helps reduce the particles generated within the processing chamber 100 having temperatures exceeding 400 degrees Celsius which in turn helps reduce defects on substrates process therein.

The body 510 of the nozzle 114 may be grit blasted or have features formed thereon. For example, a texture may be printed on the nozzle 114 during manufacturing. Alternately grit blasting may remove binding material from the $AlO_x$ to form a protecting layer of a few microns thick. The roughen the surface of the nozzle 114 additionally promotes adhesion of particles to reduce particle contamination from the nozzle 114 in the processing chamber by about 15 percent to about 20 percent. In one embodiment, the mean roughness (Ra) of the surface of the nozzle 114 (and baffle 112) may be about 1.18 microns. Additionally, the peak roughness (Ry) of the surface of the nozzle 114 (and baffle 112) may be about 9.5 microns.

A gas channel 530 may be formed along a centerline 501 of the body 510. The body 510 has a head 508 and a base 506. A gas port 520 is formed in the base 506 and is fluidly connected by the gas channel 530 to a nozzle tip 570 in the head 508. Process or cleaning gas may flow from the cooled gas feed block 110, in through the gas port 520 of the nozzle 144, through the gas channel 530 and out of the nozzle tip 570 into the processing chamber 100. For example, $NF_3$ may flow through the nozzle 114 into the processing chamber 100 for cleaning the processing chamber 100.

The nozzle tip 570 may have one or more internal profiles for affecting the velocity and/or the pressure of the gas flowing through the gas channel 530 into the processing chamber 100. FIGS. 5A through 5D are side schematic views depicting internal profiles for the nozzle tip 570 shown in FIG. 5. FIG. 5A through 5D are individual embodiments for the nozzle tip 570 in which the velocity and pressure of gas flowing therethrough the gas channel 530 may be modified upon exiting the nozzle tip 570. FIGS. 5A through 5 D will be discussed here together.

The gas channel 530 is generally cylindrical and has an outer perimeter 503. The gas channel 530 has a conical portion 505 extending from the outer perimeter 503 inward toward the centerline 501. The conical portion 506 extends from the outer perimeter 503 to an outlet 572 at the head 508 of the nozzle 114. The conical portion 506 generally reduces the cross-sectional area of the flow in the gas channel 530 from a larger area 531 corresponding to the outer perimeter 503 to a smaller area 532 corresponding to the outlet 572. The pressure of the gas at the larger area 531 is greater than the pressure of the gas at the smaller area 532. Similarly, the velocity of the gas at the larger area 531 is less than the velocity of the gas at the smaller area 532. In one embodiment, the larger area 531 may have a diameter of about 1.014 inches and the smaller area 532 may have a diameter of about 2.120 inches.

The gas channel 530 may optionally have a protuberance 560 extending from the outer perimeter 503 and in fluid communication with the gas channel 530. For example, a flow 581 of gas through the gas channel 530 may extend into the protuberance 560. A perpendicular 502 is shown in the nozzle tip 570. The perpendicular 502 intersects the center line 501 at 90 degrees, i.e., is normal thereto as well as the outer perimeter 503. The perpendicular 502 may generally bisect the protuberance 560 at the intersection of the protuberance 560 with the outer perimeter 503. The protuberance 560 may be circular or elliptical in shape, or any suitable shape. The internal profile of the nozzle 114, and in particular the protuberance 560, may be formed by sintering, casting, 3D printing or other suitable techniques.

The orientation of the protuberance 560, or whether the nozzle tip 570 has such a feature, may affect the flow characteristics of fluid flowing through the nozzle 114. The flow through the gas channel 530 may be controlled or modified, such as the velocity or pressure, at the outlet 572 by modifying the nozzle internal flow profile such as with the addition or different configurations for the protuberance 560. This is advantageous for the nozzles 114 which are larger, or that need rework, as the gas nozzles 114 may be modified to achieve a desired flow rate for gas passing therethrough. The flow rate for fluids through the nozzle 114 can be varied between about 97% to about 103% by modifying the nozzle tip. Repair and/or rework of nozzles 114 can be done with internal profiles, such as shown in FIGS. 5A through 5D, instead of scraping the nozzle 114.

Calculations for the exiting gas velocity and pressure performed as part of the discussion of FIGS. 5A through 5D below assume the gas nozzle 114 has a diameter of about 2.120 in the larger area 531 and a diameter of about 1.014 inches in the smaller area 532. However, it should be appreciated that the findings can be extended to gas nozzles 114 of different sizes. FIG. 5A illustrates one embodiment of the nozzle tip 570. The protuberance 560 on the nozzle tip 570 is oriented at an angle 562 from the perpendicular 502. In one embodiment, the angle 562 of the protuberance 560 from the perpendicular 502 is between about 15 degrees to about 60 degrees toward the base 506, such as about 45 degrees toward the base 506. For a gas nozzle 114 having the protuberance 560 at the angle 562 of about 45 degrees toward the base 506, the velocity of a gas exiting from the outlet 572 of the nozzle tip 570 is about 3.248 m/s and the pressure of said gas is about 0.1106 Torr.

FIG. 5B illustrates another embodiment of the nozzle tip 570. The protuberance 560 on the nozzle tip 570 is oriented at an angle 564 from the perpendicular 502. In one embodiment, the angle 564 of the protuberance 560 from the perpendicular 502 is between about 15 degrees to about 60 degrees toward the head 508 of the gas nozzle 114, such as about 45 degrees toward the head 508 of the gas nozzle 114. For a gas nozzle 114 having the protuberance 560 at the angle 562 of about 45 degrees toward the base 506, the velocity of a gas exiting from the outlet 572 of the nozzle tip 570 is about 2.875 m/s and the pressure of said gas is about 0.1129 Torr. The nozzle tip 570 illustrated in FIG. 5B has a positive change in velocity for the exiting gas of about 11.45% over the nozzle tip 570 illustrated in FIG. 5A. Additionally nozzle tip 570 illustrated in FIG. 5B has a negative change in pressure for the exiting gas of about 2.08% over the nozzle tip 570 illustrated in FIG. 5A.

FIG. 5C illustrates on embodiment of the nozzle tip 570. The protuberance 560 on the nozzle tip 570 is aligned with the perpendicular 502. For a gas nozzle 114 having the protuberance 560 aligned with the perpendicular 502, the velocity of a gas exiting from the outlet 572 of the nozzle tip 570 is about 3.242 m/s and the pressure of said gas is about 0.1106 Torr. The nozzle tip 570 illustrated in FIG. 5C has a positive change in velocity for the exiting gas of about 0.18% over the nozzle tip 570 illustrated in FIG. 5A. Additionally the nozzle tip 570 illustrated in FIG. 5C has substantially no change in pressure for the exiting gas over the nozzle tip 570 illustrated in FIG. 5A, e.g. the change in pressure is about 0.00%.

FIG. 5D illustrates on embodiment of the nozzle tip 570. For a gas nozzle 114 having no protuberance, as shown in FIGS. 5A through 5C, the velocity of a gas exiting from the outlet 572 of the nozzle tip 570 is about 3.252 m/s and the pressure of said gas is about 0.1106 Torr. The nozzle tip 570 illustrated in FIG. 5D has a small positive change in velocity for the exiting gas of about 0.18% over the nozzle tip 570 illustrated in FIG. 5A. Additionally the nozzle tip 570 illustrated in FIG. 5D has substantially no change in pressure for the exiting gas over the nozzle tip 570 illustrated in FIG. 5A, e.g., the change in pressure is about 0.00%.

Thus, it can be shown by FIGS. 5A through 5D that the velocity and pressure of the gas exiting from the nozzle tip 570 may be independently controlled by varying the internal profile of the nozzle tip 570.

Figure 6:
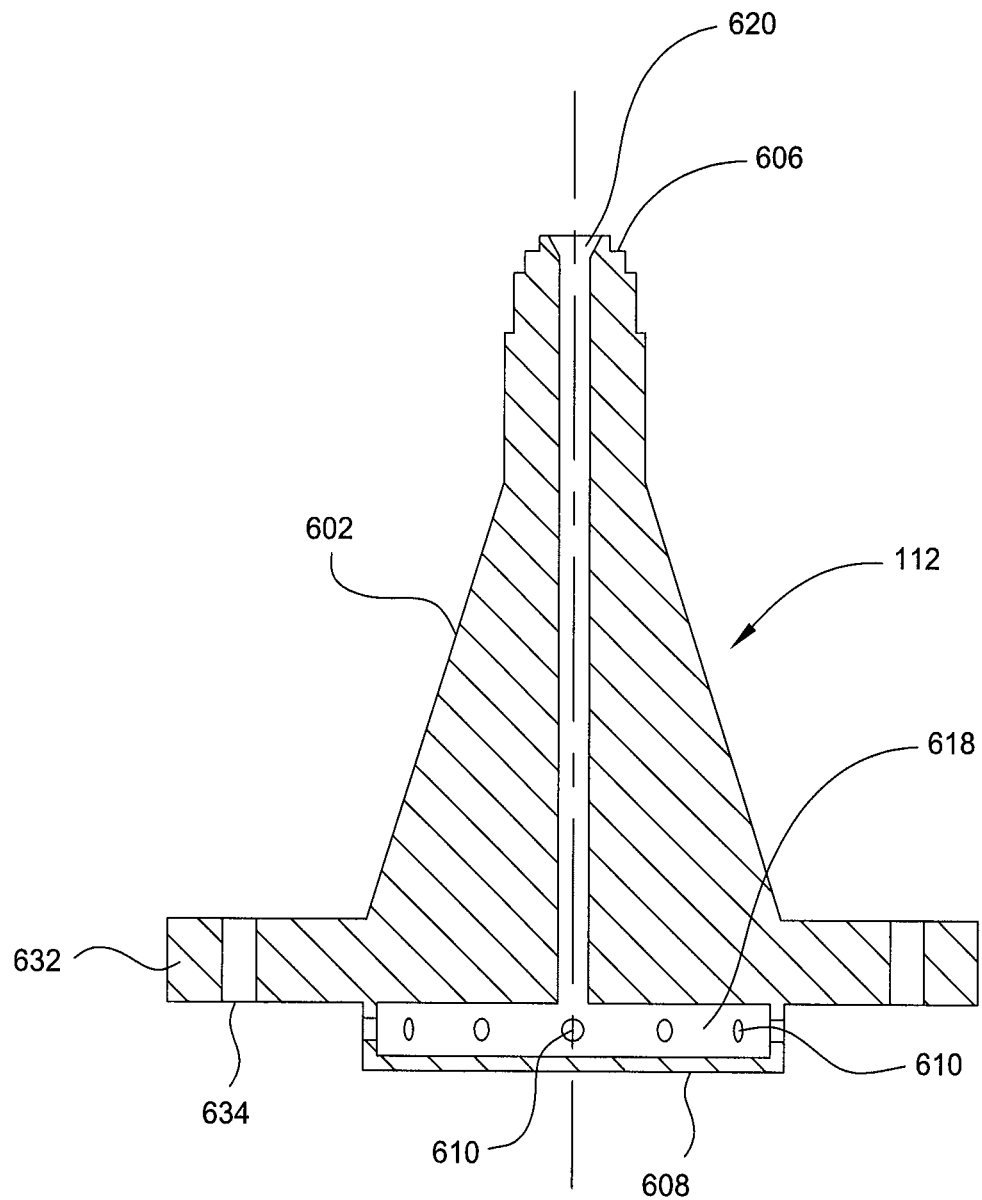
FIG. 6 is a cross sectional view of the gas baffle shown in FIG. 1.

FIG. 6 is a cross sectional view of the baffle 112 shown in FIG. 1. The baffle 112 has body 602. The body 602 has a base 606. The body 602 may also have a flange 632. One or more fasteners 634 may be formed on or through the flange 632. The fasteners 634 may help to secure the baffle 112 to the processing chamber 100. For example, the fasteners 634 may secure the baffle 112 to the dome 122. The fasteners 634 may be male or female fittings, a hole, or other suitable feature for attaching the baffle 112 to the processing chamber 100. In one embodiment, the fasteners 634 is a through hole suitably configured to accept a screw or other device. In another embodiment, the fasteners 634 may be a male slug keyed to a corresponding female fitting on the processing chamber 100.

A gas port 620 may be formed through the body 602 from the base 606 and through the flange 632. The gas port 620 is fluidly connected to a plenum 618. The plenum is disposed between the flange 632 and a head 608. The head 608 has one or more exhaust ports 610. The exhaust ports 610 fluidly connect the plenum 618 to the interior processing volume 140 of the processing chamber 100. Process or cleaning gas may flow from the cooled gas feed block 110 through the baffle 112 and out the exhaust ports 610 into the processing chamber 100. For example, $NF_3$ may flow through the baffle 112 into the processing chamber 100 for cleaning the processing chamber 100.

The body 602 of the baffle 112 may be formed from a ceramic material. For example, the body 602 may be formed from alumina, aluminum nitride, yttria, or other suitable material. In one embodiment, the body 602 of the baffle 112 is formed from aluminum nitride (AlN). The AlN body 602 may have a bulk density of about 3.3 grams/cm$^2$ and trace elements of silicon (Si) of about less than 160 parts per million (ppm), magnesium (Mg) of about less than 3 ppm, calcium (Ca) of about less than 180 ppm, titanium (Ti) of about less than 30 ppm, and Iron (Fe) of about less than 20 ppm. The baffle 112 formed from alumina has a low thermal conductivity value of less than about 15 W/mK and runs at higher temperatures then the baffle 112 formed from AlN. The baffle 112 formed from AlN has a very high thermal conductivity of greater than about 120 W/mK, such as about 140±20 W/mK, and does not get heated up during the plasma operations in the processing chamber 100. Thus, forming the baffle 112 from aluminum nitride helps reduce the particles generated within the processing chamber 100 having temperatures exceeding 400 degrees Celsius which in turn helps reduce defects on substrates process therein.

The body 602 of the baffle 112 may be grit blasted. The grit blasting may remove binding material from the $AlO_x$ to form a protecting layer of a few microns thick. The roughen the surface of the baffle 112 additionally promotes adhesion of particles to reduce particle contamination from the baffle 112 in the processing chamber by about 15 percent to about 20 percent.

Advantageously, both the nozzle 114 and the baffle 112 are formed with aluminum nitride to improve, i.e., reduce, particle generation in the interior processing volume 140 of the processing chamber 100. This increases the thermal conductivity for the nozzle 114 and the baffle 112. The cooled gas feed block 110 is designed for 200 mm HDP-CVD processing systems but the improvements may extend to other processing systems. The cooled gas feed block 110 has the cooling channels in the aluminum gas feed block to help maintain low operating temperatures for the nozzle 114 and the baffle 112. Thus, the cooled gas feed block 110, the nozzle 114 and the baffle 112 minimizes particle generation in the processing system and extends mean time between maintenance and reduces defects in processed substrates.

Figure 7:
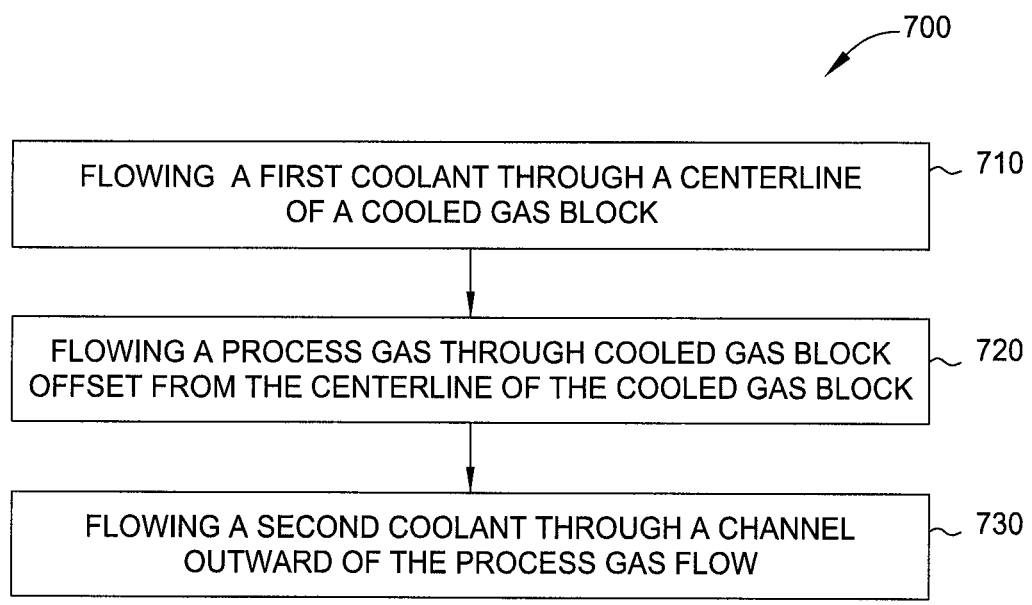
FIG. 7 is a block diagram for a method of providing gas into a processing chamber.

FIG. 7 is a block diagram for a method 700 of providing gas into a processing chamber. The method 700 begins at block 710 by flowing a first coolant through a centerline of a cooled gas block. In block 720 of the method 700, a process gas is flowed through cooled gas block offset from the centerline of the cooled gas block. In block 730, a second coolant is flowed through a channel outward of the process gas flow.

While the foregoing is directed to embodiments of the present invention, other and further embodiments of the invention may be devised without departing from the basic scope thereof, and the scope thereof is determined by the claims that follow.

What is claimed is:

1. A cooled gas feed block comprising:
a body comprising:
a main center portion having a top surface and a bottom surface; and
a flange extending outward along the bottom surface of the main center portion;
a gas channel offset from a central axis disposed through the body, the gas channel having an inlet formed in the top surface of the main center portion and an outlet formed in the bottom surface of the main center portion; and
a center coolant channel comprising:
a first portion having an inlet formed in the central axis of the top surface of the main center portion; and
a second portion coupled to the first portion, the second portion having an outlet formed a sidewall of the flange.

2. The cooled gas feed block of claim 1 further comprising:
an outer coolant channel disposed outward of the center coolant channel relative to a centerline of the main center portion.

3. The cooled gas feed block of claim 2, wherein the outer coolant channel further comprises:
a first arc shaped manifold; and
a second arc shaped manifold fluidly connected to the first arc shaped manifold by an inner conduit.

4. The cooled gas feed block of claim 2, wherein the gas channel is between the outer coolant channel and the inter coolant channel.

5. The cooled gas feed block of claim 1, wherein the first portion of the center coolant channel is formed on a centerline of the main center portion.

6. The cooled gas feed block of claim 5, wherein the first portion is not though the bottom surface.

7. The cooled gas feed block of claim 1, wherein the second is portion parallel to the bottom surface.

8. The cooled gas feed block of claim 1, wherein the main center portion has a recess formed in the bottom surface.

9. The cooled gas feed block of claim 8, wherein the second portion is adjacent the recess.

10. A processing chamber comprising:
a chamber body;
lid disposed on the chamber body;
at least one gas cooled feed block coupled to an exterior of at least one of the chamber body and lid, the gas cooled feed block comprising:
a body comprising:
a main center portion having a top surface and a bottom surface; and
a flange extending outward along the bottom surface of the main center portion;
a gas channel offset from a central axis disposed through the body, the gas channel having an inlet formed in the top surface of the main center portion and an outlet formed in the bottom surface of the main center portion; and
a center coolant channel comprising:
a first portion having an inlet formed in the central axis of the top surface of the main center portion; and
a second portion coupled to the first portion, the second portion having an outlet formed a sidewall of the flange.

11. The processing chamber of claim 10, further comprising:

a nozzle disposed on an interior of the chamber body, wherein the gas passage into the interior of the chamber body extends through the gas cooled feed block and the nozzle.

12. The processing chamber of claim 11, wherein the nozzle has a texture exposed to the interior of the chamber body.

13. The processing chamber of claim 12, wherein the texture has a mean roughness (Ra) of 1.18 microns.

14. The processing chamber of claim 10, further comprising:
a baffle disposed on an interior of the chamber body, wherein the gas passage into the interior of the chamber body extends through gas cooled feed block and the baffle.

15. The processing chamber of claim 14, wherein the baffle has a texture exposed to the interior of the chamber body.

16. The processing chamber of claim 14, wherein the baffle is disposed on the lid.

17. The processing chamber of claim 10, wherein each gas cooled feed block is associated with one nozzle or baffle.

18. A method for providing gas into a processing chamber, the method comprising:
flowing a first coolant through a centerline of a cooled gas block;
flowing a process gas through cooled gas block offset from the centerline of the cooled gas block; and
flowing a second coolant through a channel in a different direction as a direction of a process gas flow;
flowing the first coolant through a center coolant channel comprising:
a first portion having an outlet formed in a central axis of a topmost surface of the cooled gas block; and
a second portion coupled to the first portion, the second portion having an inlet formed through a sidewall of a flange extending outward along a bottom surface of the cooled gas block.

19. The cooled gas feed block of claim 1, further comprising:
a plurality of mounting points formed at an outer periphery of the body.

20. The cooled gas feed block of claim 10, further comprising:
a plurality of mounting points formed at an outer periphery of the chamber body.

* * * * *

UNITED STATES PATENT AND TRADEMARK OFFICE
CERTIFICATE OF CORRECTION

PATENT NO. : 10,662,529 B2
APPLICATION NO. : 15/141443
DATED : May 26, 2020
INVENTOR(S) : Govinda Raj et al.

It is certified that error appears in the above-identified patent and that said Letters Patent is hereby corrected as shown below:

In the Claims

In Column 12, Line 1, in Claim 1, delete "top" and insert -- topmost --, therefor.

In Column 12, Line 7, in Claim 1, delete "top" and insert -- topmost --, therefor.

In Column 12, Line 12, in Claim 1, delete "inlet" and insert -- outlet --, therefor.

In Column 12, Line 13, in Claim 1, delete "top" and insert -- topmost --, therefor.

In Column 12, Line 16, in Claim 1, delete "outlet" and insert -- inlet --, therefor.

In Column 12, Line 16, in Claim 1, after "formed" insert -- through --.

In Column 12, Lines 23-24, in Claim 3, delete "outer coolant channel" and insert -- body --, therefor.

In Column 12, Line 29, in Claim 4, delete "inter" and insert -- center --, therefor.

In Column 12, Line 36, in Claim 6, delete "though" and insert -- through --, therefor.

In Column 12, Line 38, in Claim 7, delete "is portion" and insert -- portion is --, therefor.

In Column 12, Line 50, in Claim 10, delete "top" and insert -- topmost --, therefor.

In Column 12, Line 56, in Claim 10, delete "top" and insert -- topmost --, therefor.

In Column 12, Line 61, in Claim 10, delete "top" and insert -- topmost --, therefor.

In Column 13, Line 2, in Claim 11, delete "the gas" and insert -- a gas --, therefor.

Signed and Sealed this
Eleventh Day of August, 2020

Andrei Iancu
*Director of the United States Patent and Trademark Office*

In Column 13, Line 8, in Claim 13, delete "wherein the" and insert -- wherein a --, therefor.

In Column 13, Line 13, in Claim 14, delete "the gas" and insert -- a gas --, therefor.